(12) United States Patent
Doenz et al.

(10) Patent No.: US 11,334,106 B2
(45) Date of Patent: May 17, 2022

(54) OPERATOR CONTROL DEVICE

(71) Applicant: INVENTUS Engineering GmbH, St. Anton i.M. (AT)

(72) Inventors: Philipp Doenz, Silbertal (AT); Stefan Battlogg, St. Anton i.M. (AT)

(73) Assignee: INVENTUS Engineering GmbH, St. Anton i.M. (AT)

( * ) Notice: Subject to any disclaimer, the term of this patent is extended or adjusted under 35 U.S.C. 154(b) by 0 days.

(21) Appl. No.: 17/295,544

(22) PCT Filed: Nov. 18, 2019

(86) PCT No.: PCT/EP2019/081671
§ 371 (c)(1),
(2) Date: May 20, 2021

(87) PCT Pub. No.: WO2020/104380
PCT Pub. Date: May 28, 2020

(65) Prior Publication Data
US 2022/0019255 A1      Jan. 20, 2022

(30) Foreign Application Priority Data
Nov. 20, 2018   (DE) .......................... 102018129239.2

(51) Int. Cl.
*G05G 5/03*      (2008.04)
*G05G 5/06*      (2006.01)
(Continued)

(52) U.S. Cl.
CPC ................. *G05G 5/03* (2013.01); *G05G 5/06* (2013.01); *G05G 5/26* (2013.01); *G05G 9/02* (2013.01);
(Continued)

(58) Field of Classification Search
CPC ............ G05G 1/087; G05G 5/02; G05G 5/03; G05G 5/06; G05G 5/26; G05G 9/02;
(Continued)

(56) References Cited

U.S. PATENT DOCUMENTS 3,815,436 A * 6/1974 Morimoto ............... F16H 61/18
                                                                74/473.22
7,944,335 B2    5/2011 Klossek et al.
(Continued)

FOREIGN PATENT DOCUMENTS

CN          105235518 A  *  1/2016
DE       102006002634 A1     2/2007
(Continued)

*Primary Examiner* — Adam D Rogers
(74) *Attorney, Agent, or Firm* — Laurence A. Greenberg; Werner H. Stemer; Ralph E. Locher

(57) ABSTRACT

An operator control device has an actuation unit on a console unit. The actuation unit movable between an idle position and one or more actuation positions. The actuation unit is fixable in the idle position by a retaining device. In order to leave the idle position, it is necessary to overcome a retaining force provided by the retaining device. The retaining device has a coupling device with a coupling element that is magnetically couplable to the actuation unit and to the console unit in order to magnetically fix the actuation unit in at least the idle position.

18 Claims, 6 Drawing Sheets

(51) Int. Cl.
  *G05G 9/02* (2006.01)
  *H03J 5/04* (2006.01)
  *G05G 5/26* (2006.01)
  *H03J 5/08* (2006.01)

(52) U.S. Cl.
  CPC ............ *H03J 5/04* (2013.01); *G05G 2505/00* (2013.01); *H03J 5/08* (2013.01)

(58) Field of Classification Search
  CPC .......... G05G 2505/00; H03J 5/02; H03J 5/08; H03J 5/10; H03J 5/18; H03J 5/04
  See application file for complete search history.

(56) References Cited

U.S. PATENT DOCUMENTS

| | | | |
|---|---|---|---|
| 8,138,866 B2 | 3/2012 | Kramlich et al. | |
| 9,977,456 B2 * | 5/2018 | Organ | G05G 5/06 |
| 10,007,290 B2 * | 6/2018 | Battlogg | F16D 57/002 |
| 10,088,036 B2 * | 10/2018 | Uenomachi | G05G 9/047 |
| 10,753,457 B2 * | 8/2020 | Uenomachi | B60K 20/02 |
| 10,802,528 B2 * | 10/2020 | Furuki | F16H 59/0278 |
| 10,995,849 B2 * | 5/2021 | Igarashi | F16H 61/24 |
| 11,117,466 B2 * | 9/2021 | Igarashi | F16H 61/0204 |
| 11,150,684 B2 * | 10/2021 | Spiteri | G01D 5/26 |
| 2020/0241586 A1 | 7/2020 | Dil et al. | |

FOREIGN PATENT DOCUMENTS

| | | | | |
|---|---|---|---|---|
| DE | 102006014923 A1 | 10/2007 | | |
| DE | 102007002189 A1 | 5/2008 | | |
| DE | 102008060256 A1 | 6/2010 | | |
| DE | 202017100925 U1 | 7/2018 | | |
| DE | 102017223655 A1 | 6/2019 | | |
| EP | 3098686 A2 | 11/2016 | | |
| JP | H09204234 A | 8/1997 | | |
| WO | WO-2017195432 A1 * | 11/2017 | ............ | G05G 5/03 |

\* cited by examiner

OPERATOR CONTROL DEVICE

BACKGROUND OF THE INVENTION

Field of the Invention

The present invention relates to an operator control device having at least one actuation unit and having at least one console unit. The actuation unit is received on the console unit in such a way as to be movable between at least one idle position and at least one actuation position. The actuation unit can be fixed at least in the idle position by means of at least one retaining device, such that, in order to leave at least the idle position, it is necessary for at least one retaining force provided by the retaining device to be overcome.

Operator control devices of this kind are increasingly being used in motor vehicles in order, for example, to select menus or to perform user inputs. In this case, the actuation unit is designed, for example, as a rotary knob, thus enabling various points in a menu to be selected by rotating the head. In addition, a rotary knob of this kind can sometimes also be pressed in order, for example, to confirm a menu item or to switch to a submenu.

One particularly important feature of such operator control devices is their haptics during rotation and particularly during pressing. For high-quality operator control devices, it is particularly crucial that a clearly perceivable and as precise as possible an action point is provided. Thus, operator control devices with simple springs have no or at least no clear action point, and therefore these are generally considered to be not very high-quality.

Operator control devices in which the action point is provided by a retaining device that permits a change in the position of the rotary knob only with a certain expenditure of force have therefore been disclosed. In this case, the action point is achieved by means of "click plates" or, alternatively, by means of magnets. However, the known systems are very much in need of improvement in respect of their haptics and their structural design as well as their cost of production.

SUMMARY OF THE INVENTION

Given this situation, it is the object of the present invention to make available an improved operator control device which, in particular, offers particularly high-quality haptics.

This object is achieved by means of an operator control device having the features as claimed. Preferred developments of the invention form the subject matter of the dependent claims. Further advantages and features of the present invention will be found in the general description and the description of the exemplary embodiments.

The operator control device according to the invention comprises at least one actuation unit and at least one console unit. The actuation unit is received in the console unit in such a way as to be movable between at least one idle position and at least one actuation position. The actuation unit can be fixed at least in the idle position by means of at least one retaining device, such that, in order to leave at least the idle position, it is necessary for at least one retaining force provided by the retaining device to be overcome. In this case, the retaining device comprises at least one coupling device having at least one coupling element magnetically couplable to the actuation unit and to the console unit. Preferably at least the idle position can thereby be magnetically fixed.

The operator control device according to the invention offers many advantages. One considerable advantage is provided by the coupling device having the coupling element which can be coupled magnetically both to the actuation unit and to the console unit. This allows particularly good and high-quality haptics. By means of the invention, it is possible to achieve a clearly perceivable and particularly precise action point. One particular advantage is that the actuation unit is fixed in a particularly stable way in the idle position and can be actuated in this position or out of the idle position with a particularly high-quality haptic feel.

The coupling device preferably comprises at least four coupling sections. In particular, at least one coupling section arranged on the coupling element can be coupled magnetically to at least one coupling section arranged on the actuation unit. In particular, at least one further coupling section arranged on the coupling element can be coupled magnetically to at least one coupling section arranged on the console unit. This results in particularly advantageous structural coupling. In particular, the coupling element comprises at least two coupling sections. In particular, the actuation unit comprises at least one coupling section. In particular, the console unit comprises at least one coupling section.

It is preferred that the couplable coupling sections are arranged closer to one another at least in the idle position than outside the idle position and, in particular, in the at least one actuation position. It is also preferred that, at least in the idle position, the couplable coupling sections are arranged against one another over a larger area than outside the idle position and, in particular, in the at least one actuation position. In this context, couplable coupling sections are understood, in particular, to be a combination of in each case at least one coupling section of the coupling element with the respective coupling section of the actuation unit or of the console unit. Such an embodiment offers particularly high-quality haptics when the actuation unit is moved out of the idle position into an actuation position. It is particularly advantageous in this case that the idle position is fixed in a very stable and at the same time haptically particularly pleasant manner.

The magnetic attraction between the couplable coupling sections is preferably greater at least in the idle position than outside the idle position. In particular, the couplable coupling sections are designed to magnetically attract. In this case, at least one coupling section of the couplable coupling sections can be equipped with at least one magnet unit and, for example, with a magnet. It is also possible for two or more or all of the coupling sections of the couplable coupling sections to be equipped with a magnet unit.

It is preferred that the couplable coupling sections lie flat against one another at least in the idle position. In particular, the couplable coupling sections rest flat against one another exclusively in the idle position. In particular, the couplable coupling sections lie against one another along in each case one contact surface, wherein the main planes of these contact surfaces are oriented substantially parallel and, in particular, parallel to one another at least in the idle position.

In particular, the couplable coupling sections are arranged so as to rest against one another outside the idle position and, in particular, in the at least one actuation position. It is also possible that the couplable coupling sections are arranged at a distance from one another outside the idle position and, in particular, in the at least one actuation position and, in particular, are arranged so as not to touch one another.

It is possible and preferred that the couplable coupling sections are arranged obliquely to one another outside the idle position. In particular, the main planes of the contact surfaces of the coupling sections are arranged obliquely to one another. For example, the coupling sections are arranged at an angle of between 8° and 90° outside the idle position and, in particular, in the actuation position. Other angles are also possible.

The actuation unit can preferably be moved automatically out of a position outside the idle position, in particular out of at least one of the at least one actuation position, back into the idle position by means of the magnetic attraction between the couplable coupling sections. In particular, the retaining device is suitable and designed to automatically reset the actuation unit back into the idle position by means of the coupling device when there is no actuation taking place or no force is being exerted on the actuation unit from the outside.

In a particularly advantageous embodiment, the actuation unit can also be fixed in at least one of the at least one actuation position by means of the retaining device, such that, in order to leave this actuation position, it is likewise necessary for at least one retaining force provided by the retaining device to be overcome. This has the advantage that the actuation unit is fixed in a stable and haptically particularly pleasant way not only in the idle position but also in one of the provided actuation positions.

In particular, the actuation unit can be moved between the idle position and at least two actuation positions. In this case, the actuation unit can, in particular, be fixed in at least one of the two actuation positions by means of the retaining device. In particular, the actuation unit can in this case preferably be moved automatically out of at least one of the two actuation positions back into the idle position by means of the magnetic attraction between the couplable coupling sections.

For this purpose, the retaining device has, in particular, at least one further coupling section arranged on the actuation unit. It is also possible that for this purpose the retaining device has at least one further coupling section arranged on the console unit. In this case, the further coupling section can be coupled magnetically in at least one of the two actuation positions and preferably in the aforementioned actuation position to at least one of the coupling sections arranged on the coupling element.

It is preferred that the coupling element is attached movably and in particular tiltably to the actuation unit and/or to the console unit. It is also possible that the coupling element is attached rotatably and/or pivotably and/or in a hinged manner to the actuation unit and/or the console unit. Such attachment can be understood to mean both permanently fixed and detachable or loose fastening. The coupling element is preferably of tiltable design.

The coupling element preferably performs at least one tilting movement when the actuation unit moves between the idle position and the actuation position and/or back. It is also possible that the coupling element is rotated and/or pivoted and/or translated when the actuation unit moves.

In particular, the coupling element is oriented obliquely to an axis of movement and/or to a longitudinal axis and/or to a transverse axis of the actuation unit outside the idle position. In the idle position, the coupling element is preferably oriented substantially at right angles and, in particular, at right angles or substantially parallel and, in particular, parallel to the axis of movement and/or to the longitudinal axis and/or to the transverse axis of the actuation unit.

In a particularly advantageous embodiment, the actuation unit can be moved into at least two actuation positions. In this case, it is preferred that, when the actuation unit moves from the idle position into a first actuation position, the coupling element performs an inverse tilting movement to that when the actuation unit moves from the idle position into a second actuation position. This permits a particularly compact and at the same time particularly reliable structural design.

In all the embodiments, it is preferred that in each case at least one of the couplable coupling sections comprises at least one magnet element or is designed as such. It is also possible and preferred that the further coupling section comprises at least one magnet element. The magnet element can comprise, for example, a neodymium magnet or can be designed as such. The magnet element is, in particular, joined to the coupling section and, for example, adhesively bonded. The corresponding magnet elements are oriented, in particular, in such a way that the couplable coupling sections have a magnetically attractive effect on one another.

It is possible that the coupling element is manufactured from a magnetically non-conductive material. The coupling element is manufactured from an aluminum material or some other metallic material, for example. Other materials, e.g. plastic, are also possible. The coupling element can be manufactured from a magnetically conductive material.

The coupling element is preferably of disk-type design. In particular, the coupling element is designed as a disk or comprises at least one such disk. This offers particularly compact and space-saving accommodation. The coupling element can also be annular or can be designed as a ring. It is also possible that the coupling element is designed as a plate or comprises at least one such plate. Other embodiments of the coupling element, for example as a lever and/or rod and/or bar or the like, are also possible.

In all the embodiments, it is preferred that the actuation unit has at least one shaft, which is accommodated movably and, in particular, rotatably in the console unit. In particular, the shaft is attached firmly and preferably for conjoint rotation to the actuation unit. In particular, the shaft passes through the console unit and is preferably supported therein. As a particular preference, the shaft passes through an aperture in the coupling element. For example, the coupling element is designed as a disk with a central aperture, wherein the shaft extends through the aperture. In particular, the console unit is arranged between a knob, preferably a rotary knob, of the actuation unit and the coupling element. Other arrangements are also possible.

In particular, the coupling element is arranged tiltably on the shaft. For this purpose, the aperture in the coupling element is designed to be larger than the outside diameter of the shaft, for example. This allows a structurally particularly inexpensive implementation of the tiltable coupling element.

It is particularly preferred that the movement of the actuation unit between the idle position and the at least one actuation position takes place along a longitudinal axis of the shaft. This has the advantage that the actuation unit can be pressed or pulled, for example, and that, in the process, the shaft moves into or out of the console unit.

In a particularly advantageous embodiment, it is envisaged that the coupling section of the actuation unit is moved toward the coupling section of the console unit by a movement of the actuation unit in one direction and, in particular, by pulling the actuation unit.

In this case, the coupling section of the actuation unit and/or the coupling section of the console unit press/presses onto the respective coupling section of the coupling element, with the result that, in particular, the coupling element performs a tilting movement and, in particular, the couplable coupling sections move away from one another at least in some section or sections owing to the tilting of the coupling element.

It is also preferred that the coupling section of the actuation unit and the coupling section of the console unit are moved away from one another by a movement of the actuation unit in another direction, and in particular by pressing the actuation unit. In this case, it is preferred that the coupling section of the actuation unit and/or the coupling section of the console unit remain/s stuck to the respective coupling section of the coupling element owing to magnetic attraction, with the result that, in particular, the coupling element performs a tilting movement and the couplable coupling sections move further away from one another at least in some section or sections owing to the tilting of the coupling element.

In all the embodiments, it is particularly preferred that the coupling section of the actuation unit and/or the coupling section of the console unit can be moved linearly by pressing and/or pulling the actuation unit. In particular, pressing and/or pulling the actuation unit result/s in movement of the shaft of the actuation unit into the console unit and out of the console unit. In particular, pressing and/or pulling the actuation unit result/s in linear movement of the coupling section of the actuation unit.

In all the embodiments, it is likewise preferred that the coupling element can be coupled simultaneously to the actuation unit and to the console unit. In particular, the coupling element is coupled simultaneously to the actuation unit and to the console unit. In particular, the coupling element is coupled both to the actuation unit and to the console unit both in the idle position and in the at least one actuation position, and preferably in all the actuation positions.

In a particularly advantageous embodiment, the actuation unit can be moved into at least two actuation positions. In particular, the actuation unit can be moved into at least one first and at least one second actuation position. The idle position preferably lies between the first actuation position and the second actuation position. In particular, the idle position represents a stable or magnetically fixed central position or intermediate position between the actuation positions.

The actuation unit can preferably be moved out of the idle position into the first actuation position by being pressed. The actuation unit can preferably be moved out of the idle position into the second actuation position by being pulled.

In an advantageous development, the actuation unit is at least partially rotatable in addition to being movable between the idle position and the at least one actuation position. In particular, the rotary motion takes place about an axis of rotation which is preferably provided by the axis of the actuation unit. For the rotational movement, the shaft of the actuation unit is rotatably mounted, in particular in the console unit. In particular, the shaft of the actuation unit is also mounted for translation in the console unit.

As a particular preference, the actuation unit is designed as a rotary knob. As a particular preference, the rotary knob is also capable of being pulled and/or pressed (push/pull rotary knob). In particular, the change from the idle position to the at least one actuation position is accomplished by pulling and/or pressing the rotary knob.

In a likewise advantageous development, the rotatability of the actuation unit can be at least partially damped and/or delayed and/or blocked by means of at least one damper device. In particular, a rheological and preferably magnetorheological and/or electrorheological damper device is provided. Other types of damper device are also possible.

The rotatability of the actuation unit preferably has haptic feedback. In particular, the haptic feedback is dynamically adjustable. The haptic feedback is preferably adjustable as a function of an angle of rotation and/or at least one sensor signal. In particular, haptic feedback is accomplished by activation of the damper device. It is possible, for example, for a different number of haptically perceptible stops to be set during the rotation of the actuation unit, depending on the menu function.

In particular, at least one user input can be carried out by pulling and/or pressing and/or rotating the actuation unit. It is also possible for at least one menu selection and/or some other control process to be carried out by pulling and/or pressing and/or rotating the actuation unit.

In all the embodiments, it is particularly preferred that the actuation unit can be moved at least partially manually and, in particular, can be moved manually. In particular, the actuation unit can be fixed non-positively at least in the idle position by means of the retaining device. In particular, no positive fixing by the retaining device is provided. However, it is also possible for positive fixing by the retaining device to be provided.

In the context of the present invention, a position outside the idle position is understood, in particular, as a position of the actuation unit in at least one of the at least one or two actuation position. It is possible that mobility of the actuation unit beyond the at least one actuation position is blocked by at least one stop. It is possible to provide at least two stops, which block the mobility of the actuation unit beyond at least two actuation positions. In this case, the idle position preferably lies between the two stops or between the two actuation positions.

Further advantages and features of the present invention will be found in the description of the exemplary embodiments, which will be explained below with reference to the accompanying figures.

DETAILED DESCRIPTION OF THE INVENTION

Figure 1:
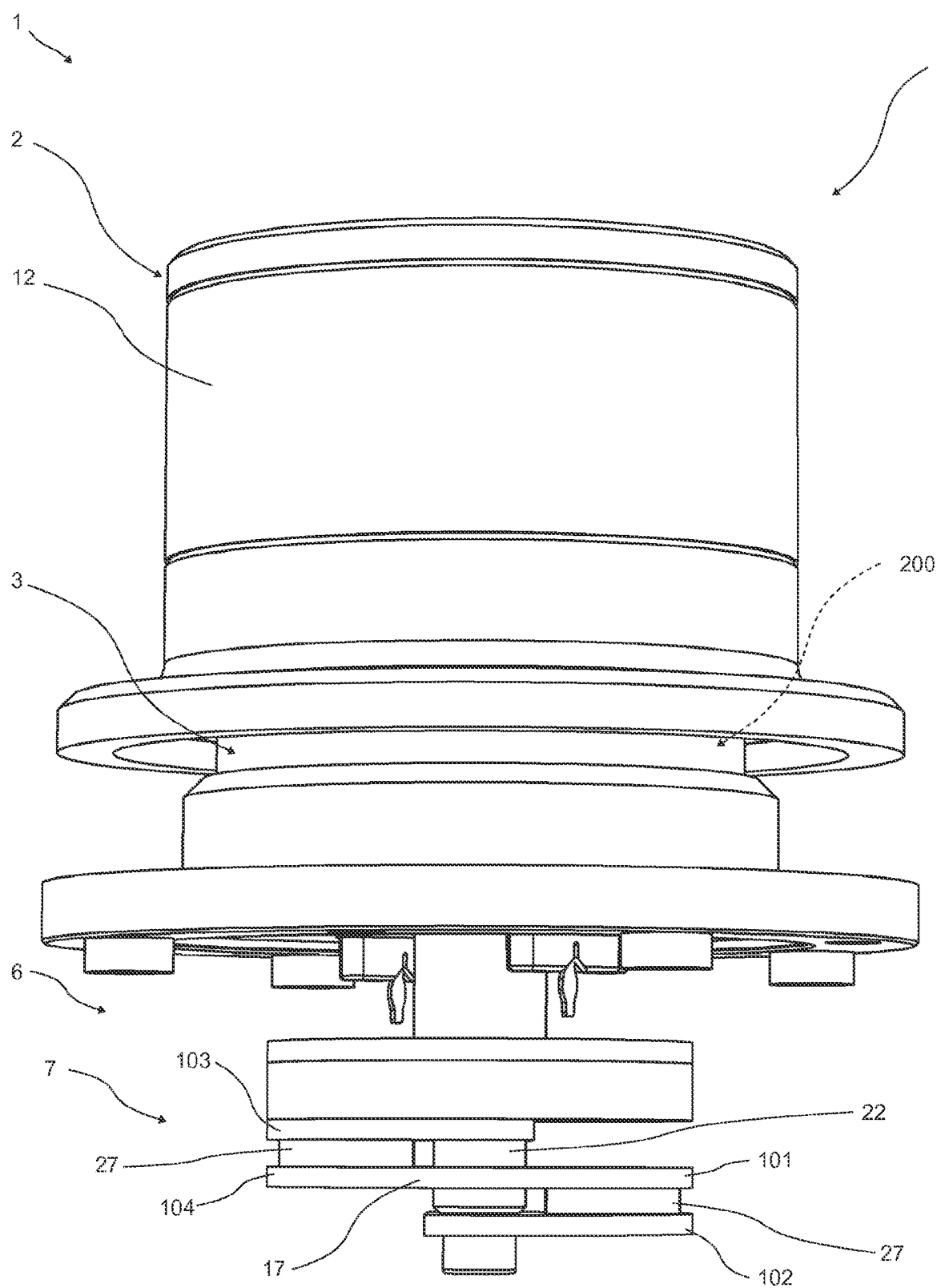
FIG. 1 shows a schematic illustration of an operator control device according to the invention in an idle position.

FIG. 1 shows an operator control device 1 according to the invention with an actuation unit 2 mounted rotatably and translatably in a console unit 3. Here, the actuation unit 2 is designed as a rotary knob 12. As a result, operation takes place here both by rotating and by pressing and pulling the rotary knob 12. The console unit 3 can be mounted on an object to be operated and, for example, in an interior of a motor vehicle.

The rotary motion of the knob 12 is damped here by a magnetorheological damper device 200 arranged without being visible in the interior of the operator control device 1. Here, the damper device 200 also allows haptic feedback during the rotary motion of the rotary knob 12, e.g. by means of a correspondingly perceptible detent action or by means of dynamically adjustable stops.

Thus, for example, a specific setting of a menu is selected by rotating the rotary knob 12. The selection is then confirmed, for example, by pressing the rotary knob 12. Here, the damper device 200 adapts the number of haptically perceptible stops to the number of selectable menu settings. Exiting a menu or selecting a submenu is accomplished, for example, by pulling the rotary knob 12.

Figure 2:
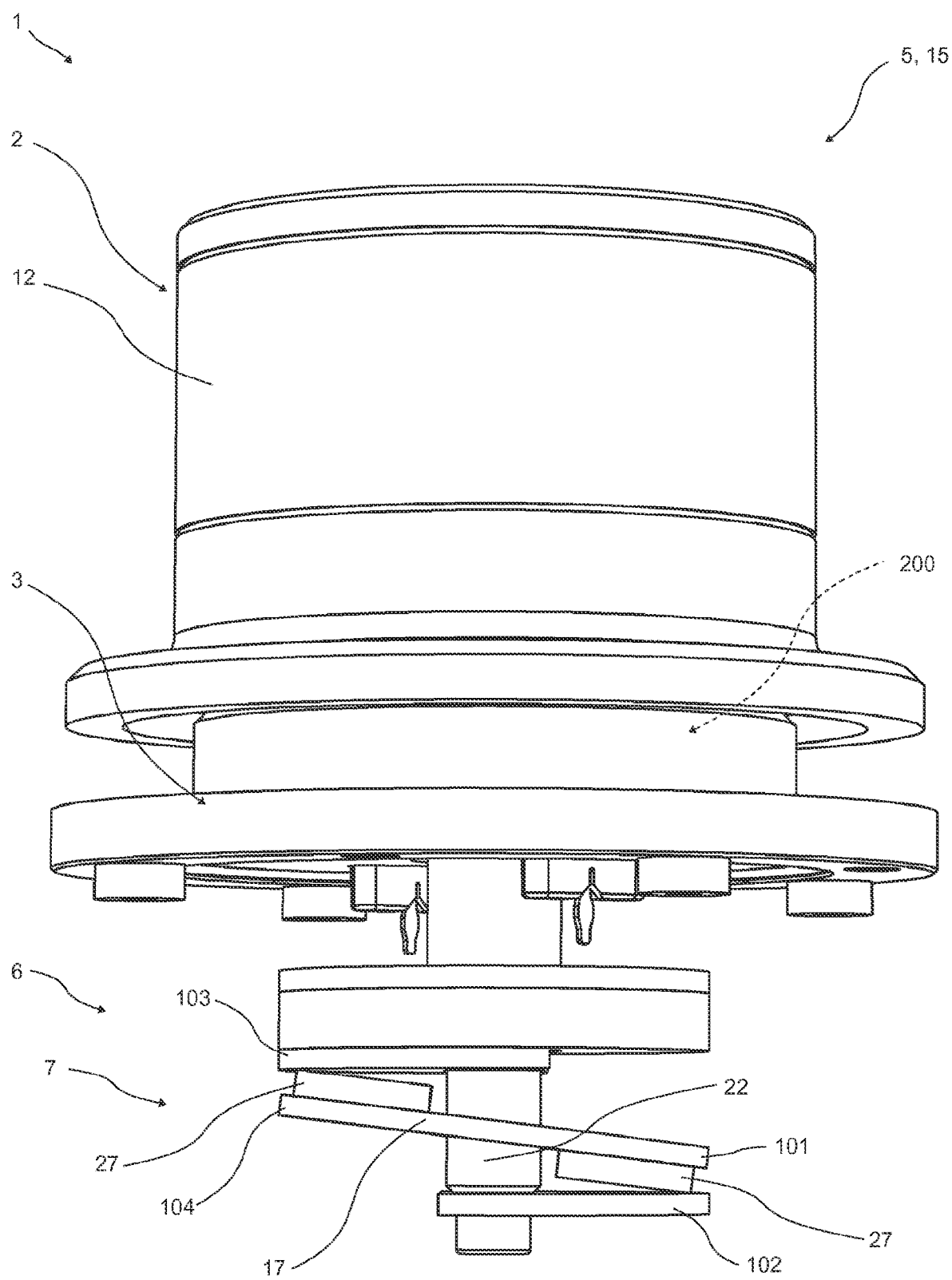
FIG. 2 shows the operator control device in an actuation position.
Figure 3:
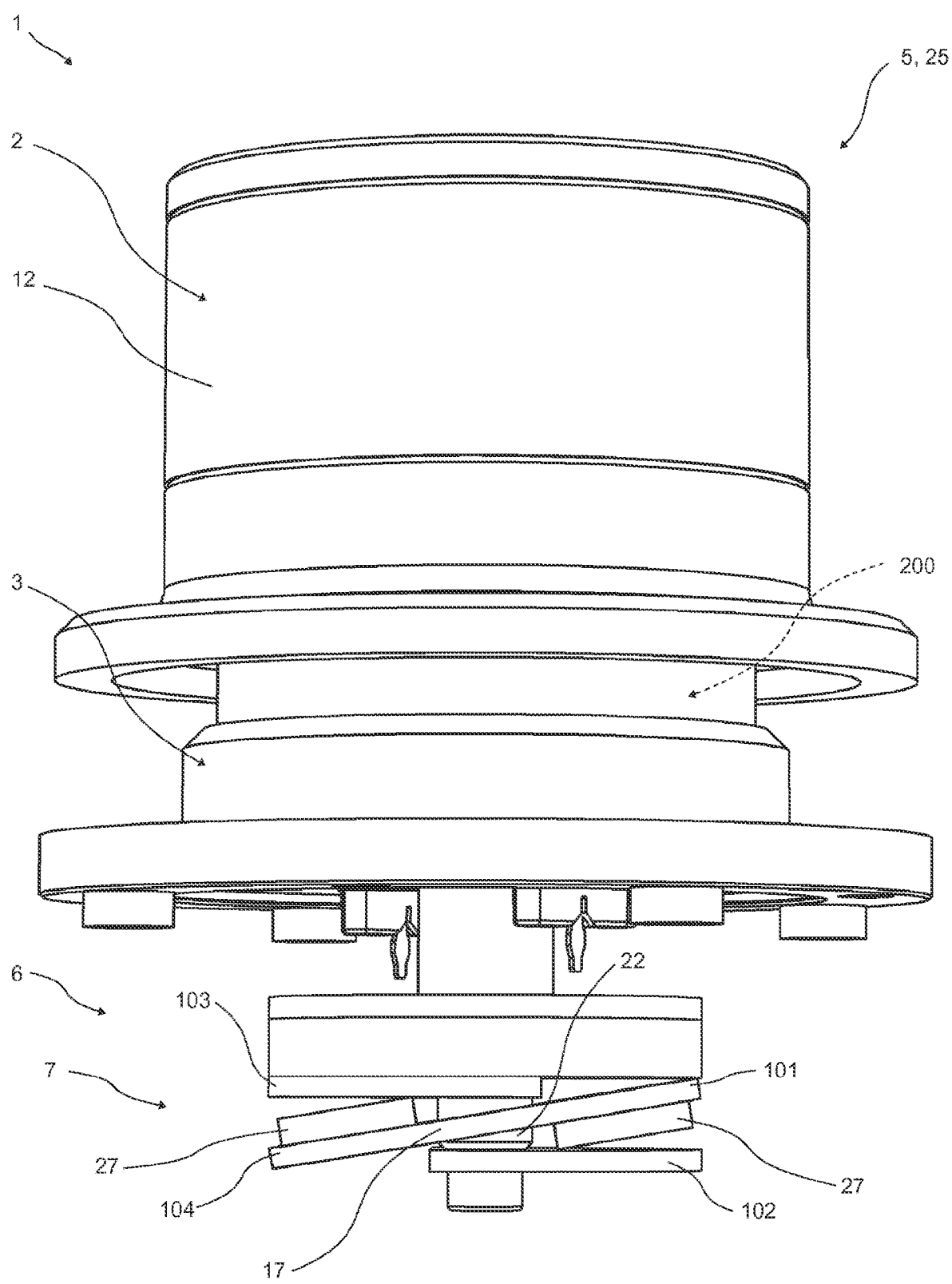
FIG. 3 shows the operator control device in a different actuation position.
Figure 4:
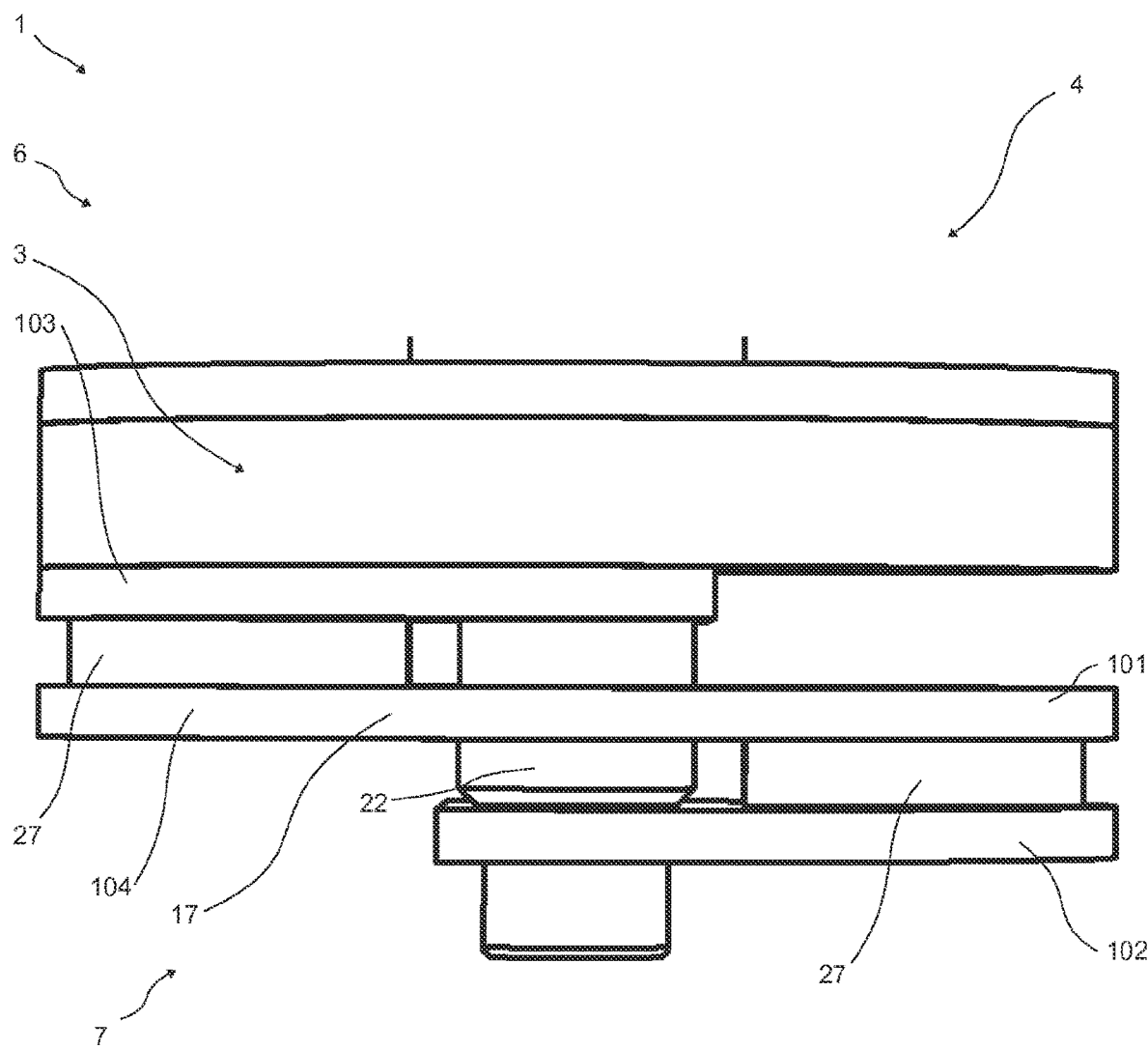
FIG. 4 shows an enlarged illustration of the operator control device according to FIG. 1.
Figure 5:
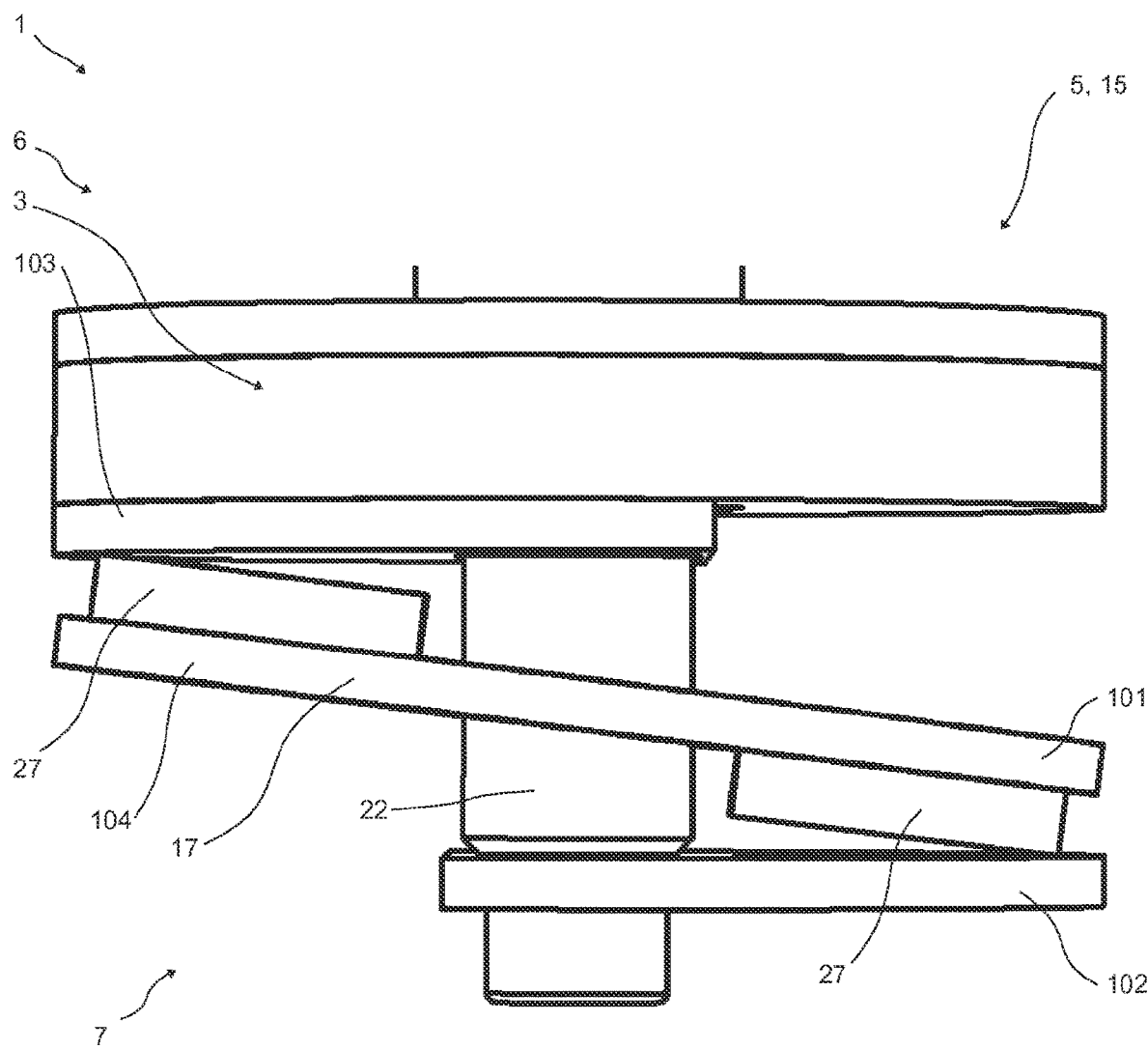
FIG. 5 shows an enlarged illustration of the operator control device according to FIG. 2.
Figure 6:
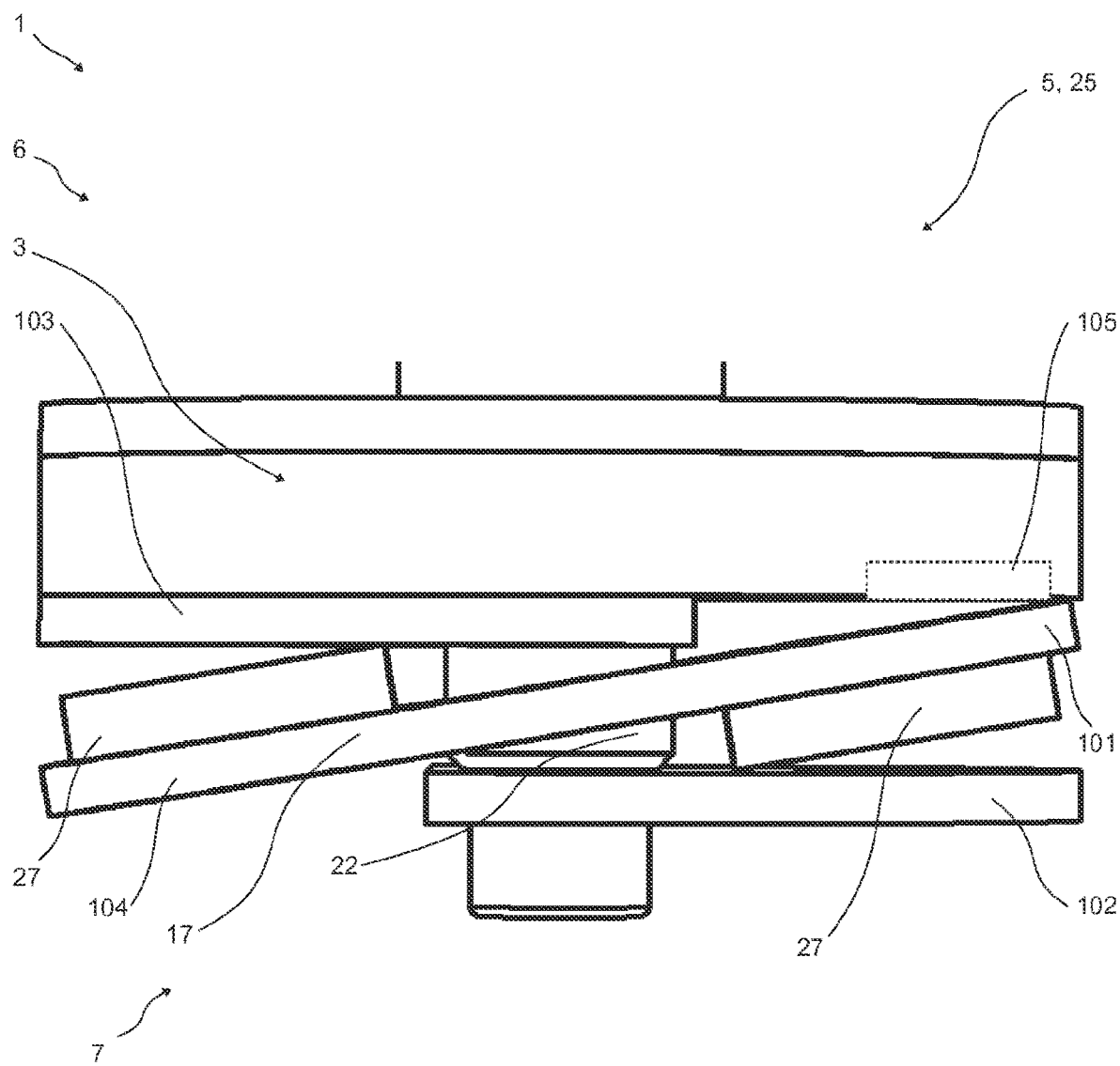
FIG. 6 shows an enlarged illustration of the operator control device according to FIG. 3.

Here, the actuation unit 2 can be moved between an idle position 4 and two actuation positions 5, namely a first actuation position 15 and a second actuation position 25. In this case, the idle position 4 is shown in FIG. 1 and the first actuation position 15 is shown in FIG. 2 and the second actuation position 25 is shown in FIG. 3. An enlarged illustration of the operator control device 1 is shown in FIGS. 4 to 6. Here, FIG. 4 shows the idle position 4, FIG. 5 shows the first actuation position 15, and FIG. 6 shows the second actuation position 25.

Here, the actuation unit 2 comprises a shaft 22, which is secured on the rotary knob 12 and extends through the console unit 3. If the rotary knob 12 is pressed or pulled, the shaft 22 slides downward out of the console unit 3 or is pulled into it in the orientation shown here.

Here, the actuation unit 2 can be fixed in the idle position 4 by means of a retaining device 6. As a result, a retaining force provided by the retaining device 6 must be overcome in order to leave the idle position 4.

In order to allow particularly advantageous and high-quality haptics during operation, the retaining device 6 is equipped with a coupling device 7. The coupling device 7 comprises a coupling element 17, which is designed here in the manner of a disk and which can be coupled magnetically to the actuation unit 2 and the console unit 3.

For this purpose, the coupling element 17 is here equipped with two magnet elements 27. The magnet elements 27 are, for example, neodymium magnets adhesively bonded onto the coupling element 17. The coupling element is made of an aluminum material, for example.

The coupling device 7 here comprises four coupling sections 101 to 104. In this case, coupling section 102 is arranged in a fixed manner on the shaft 22 of the actuation unit 2. Here, coupling section 103 is arranged in a fixed manner on the console unit 3. The other two coupling sections 101, 104 are here arranged on opposite sides of the coupling element 17 and are each equipped with a magnet element 27. In the arrangement shown here, it is possible, on the one hand, for coupling section 101 and coupling section 102 to be coupled to one another and, on the other hand, for coupling section 103 and coupling section 104 to be coupled to one another.

In the idle position 4, the couplable or coupled coupling sections 101 to 104 rest against one another over a correspondingly large area. Particularly good magnetic attraction between the associated coupling sections 101 to 104 is thereby achieved, and therefore particularly stable fixing of the rotary knob 12 in the idle position 4 is obtained.

As can be seen particularly clearly in FIGS. 2 and 5, coupling section 102 and coupling section 103 move away from one another when the rotary knob 12 is pressed. During this process, the coupling element 17 performs a tilting movement, with the result that its coupling sections 101, 104 rest obliquely against coupling sections 102, 103. When the rotary knob 12 is pressed, it is thereby possible initially to apply a higher, readily perceptible force and then a decreasing, comfortable force.

By virtue of the pressing action, the rotary knob 12 adopts the first actuation position 15. If the rotary knob 12 is released in this position 15, the couplable coupling sections 101 to 104 are attracted magnetically to one another. As a result, the rotary knob 12 is returned automatically to the idle position 4 and correspondingly fixed in said position.

By pulling the rotary knob 12, the latter is transferred here into the second actuation position 25, which can be seen particularly clearly in FIGS. 3 and 6. Pulling the rotary knob 12 moves coupling section 102 in the direction of coupling section 103. The couplable coupling sections 101 to 104 are thereby pressed against one another, resulting in tilting of the coupling element 17. As a result, the couplable coupling sections 101 to 104 move away from one another in each case, so that, when the rotary knob 12 is pulled too, the further the rotary knob 12 is pulled, the more the required force decreases. Owing to the magnetic attraction between the couplable coupling sections 101 to 104, there is automatic return of the rotary knob 12 from the second actuation position 25 to the idle position 4 in this case too.

In a development, one or two or more further coupling sections 105 can be provided, by means of which magnetic fixing of the rotary knob 12 is accomplished, e.g. in one of the actuation positions 5. Such a further coupling section 105 is shown in a highly schematic way in FIG. 6, for example.

Here, this coupling section 105 is secured on the console unit 3, and it is therefore connected to the coupling section 101 of the coupling element 17 by magnetic attraction in the second actuation position 25. For this purpose, the further coupling section 105 is equipped here with a correspondingly oriented magnet element. In order to leave the second actuation position 25, the magnetic retaining force must then be correspondingly overcome. At the same time, the invention presented here also imparts particularly high-quality haptics when the rotary knob 12 is released from the second actuation position 25. Subsequently, for example, the magnetically fixed idle position 4 is again adopted.

LIST OF REFERENCE SIGNS 1 operator control device
2 actuation unit
3 console unit
4 idle position
5 actuation position
6 retaining device
7 coupling device
12 rotary knob
15 actuation position
17 coupling element
22 shaft
25 actuation position
27 magnet element
101 coupling section
102 coupling section
103 coupling section
104 coupling section
105 coupling section
200 damper device

The invention claimed is:
1. An operator control device, comprising:
a console unit;
an actuation unit movably disposed on said console unit between at least one idle position and at least one actuation position;

a retaining device configured for fixing said actuation unit in the idle position, said retaining device providing a retaining force which must be overcome in order to leave the idle position;

said retaining device having a coupling device with at least one coupling element magnetically couplable to said actuation unit and to said console unit in order to magnetically fix said actuation unit in the idle position;

said retaining device being configured to fix said actuation unit in the at least one actuation position with a retaining force which must be overcome in order to leave the at least one actuation position.

2. The operator control device according to claim 1, wherein said coupling device comprises at least four coupling sections, and wherein at least one of said at least four coupling sections is arranged on said coupling element and is magnetically couplable to at least one of said at least four coupling sections arranged on said actuation unit, and wherein another one of said at least four coupling sections is arranged on said coupling element and is magnetically couplable to another one of said at least four coupling sections on said console unit.

3. The operator control device according to claim 2, wherein at least one of said coupling sections of a further coupling section comprises at least one magnet element.

4. The operator control device according to claim 2, wherein said at least four coupling sections are arranged closer to one another in the idle position than outside the idle position, and/or wherein, in the idle position, said at least four coupling sections are arranged against one another over a larger area than outside the idle position.

5. The operator control device according to claim 2, wherein a magnetic attraction between respective said coupling sections is greater in the idle position than outside the idle position.

6. The operator control device according to claim 2, wherein said actuation unit is automatically movable out of a position outside the idle position, back into the idle position, by a magnetic attraction between at least two of said at least four coupling sections.

7. The operator control device according to claim 2, wherein said at least one further coupling section arranged on said actuation unit and/or said at least one further coupling section arranged on said console unit is magnetically couplable in the actuation position to at least one of said at least four coupling sections arranged on said coupling element.

8. The operator control device according to claim 1, wherein, outside the idle position, said coupling element is oriented obliquely to at least one of an axis of movement, or a longitudinal axis, or a transverse axis of said actuation unit.

9. The operator control device according to claim 1, wherein said at least one actuation position is one of at least two actuation positions, and said actuation unit is movably mounted into said at least two actuation positions, and wherein, when said actuation unit moves from the idle position into a first actuation position of said at least two actuation positions, said coupling element performs an inverse tilting movement to when said actuation unit moves from the idle position into a second actuation position of said at least two actuation positions.

10. The operator control device according to claim 1, wherein said at least one coupling element is formed of a magnetically non-conductive material.

11. The operator control device according to claim 1, wherein said at least one actuation position is one of at least two actuation positions, and said actuation unit is configured for a movement out of the idle position and into a first actuation position of said at least two actuation positions by being pressed and for a movement out of the idle position and into a second actuation position of said at least two actuation positions by being pulled.

12. The operator control device according to claim 1, wherein said actuation unit is mounted for at least a partial rotation in addition to being movable between the idle position and the at least one actuation position.

13. The operator control device according to claim 1, wherein said actuation unit is rotatable with dynamically adjustable haptic feedback.

14. The operator control device according to claim 1, wherein said actuation unit is configured for user input by at least one of pulling, pressing, or rotating said actuation unit.

15. An operator control device, comprising:

a console unit;

an actuation unit movably disposed on said console unit between at least one idle position and at least one actuation position;

a retaining device configured for fixing said actuation unit in the idle position, said retaining device providing a retaining force which must be overcome in order to leave the idle position;

said retaining device having a coupling device with at least one coupling element magnetically couplable to said actuation unit and to said console unit in order to magnetically fix said actuation unit in the idle position;

wherein a coupling section of said actuation unit is moved toward a coupling section of said console unit by a movement of said actuation unit in a pulling direction when said actuation unit is pulled.

16. The operator control device according to claim 15, wherein said retaining device is configured to fix said actuation unit in the at least one actuation position with a retaining force which must be overcome in order to leave the at least one actuation position.

17. The operator control device according to claim 15, wherein said coupling section of said actuation unit and said coupling section of said console unit are moved away from one another by a movement of said actuation unit in a direction opposite the pulling direction, being a pressing direction.

18. An operator control device, comprising:

a console unit;

an actuation unit movably disposed on said console unit between at east one idle position and at least one actuation position;

a retaining device configured for fixing said actuation unit in the idle position, said retaining device providing a retaining force which must be overcome in order to leave the idle position;

said retaining device having a coupling device with at least one coupling element magnetically couplable to said actuation unit and to said console unit in order to magnetically fix said actuation unit in the idle position; and at least one rheological damper device for damping or blocking a rotation of said actuation unit.

* * * * *